July 12, 1966 H. WEISS 3,260,980

SEMICONDUCTOR DEVICE OF LOW THERMOELECTRIC ERROR VOLTAGE

Filed March 13, 1963

United States Patent Office 3,260,980

Patented July 12, 1966

3,260,980

SEMICONDUCTOR DEVICE OF LOW THERMO-ELECTRIC ERROR VOLTAGE

Herbert Weiss, Nurnberg, Germany, assignor to Siemens-Schuckertwerke Aktiengesellschaft, Berlin-Siemensstadt, Germany, a corporation of Germany Filed Mar. 13, 1963, Ser. No. 264,861
Claims priority, application Germany, Mar. 15, 1962, S 78,497
5 Claims. (Cl. 338—32)

My invention relates to electronic semiconductor devices of reduced susceptibility to operational disturbance by thermoelectric effects, and in one of its particular aspects to semiconductor devices of the galvanomagnetic type, such as Hall voltage generators and magnetic-field responsive resistors, of improved insensitivity to temperature changes.

In general, the occurrence of temperature differences in the crystalline body of a semiconductor device result in thermoelectric voltages which, in some cases of use, may impair or falsify the desired operation. For example, many purposes for which galvanomagnetic semiconducting components, such as Hall voltage generators or magnetic-field responsive resistors are employed, the signal voltages are in the order of micro volts ($\mu$v.). This is the case, for example, when a Hall-voltage generator is applied for measuring magnetic fields of less than 1 gauss field strength, or when a magnetic-field responsive semiconducting resistor is applied for modulating low direct voltages. Referring to a semiconductor body of indium antimonide, the occurring thermo-voltages in such cases may be up to about 300 $\mu$v./° C. under ordinary operating conditions.

It has become known (from U.S. Patent 2,855,549) to minimize or compensate such thermoelectric error voltages by various combinations of semiconductor structures.

It is an object of my invention to achieve an improved and virtually complete elimination of thermoelectric error voltages by a much simpler means than heretofore available. More particularly, it is an object of my invention to secure freedom from thermo-disturbances simply by giving the semiconductor film, wafer or other crystalline layer that constitutes the main body of the device, a geometric shape during deposition or other production of the body, thus doing away with the necessity of subsequently combining the semiconductor with other thermoelectric compensating structures, and thus reducing the production cost considerably below that of the known thermo-compensated devices.

According to a feature of my invention, the crystalline semiconductor member, such as a layer of semiconductor elemental substance or compound, deposited upon a substrate is given a coherent geometric shape on which the two output points that constitute the pair of electrodes for the signal output voltage are spacially juxtaposed at substantially the same spot so that they are both subjected to the same temperature. In this manner, disturbing temperature differences between the signal electrode points of the semiconductor body are eliminated.

This effect, according to another feature of my invention, is preferably augmented by disposing the signal-voltage contact points of the semiconductor body on or within a good conducting medium, for example, on a copper plate. In magnetically controllable semiconductor devices, for example Hall-voltage generators or magnetic-field responsive resistors, it is further preferable to dispose the above-mentioned spacially juxtaposed signal-voltage points of the semiconductor body outside the active range of the controlling magnetic field.

According to another, more specific feature of my invention, the geometric shape of the crystalline semiconductor layer, wafer or other member has a main portion and two extremities, these extremities being integrally joined with the main portion and extending away therefrom and then toward each other up to a mutual minimum distance smaller than their mutual spacing at their respective junctions with the main portion. The two signal output points are located at the ends of the respective extremities, and the entire semiconductor member occupies essentially a single plane.

The foregoing and more specific features of my invention will be apparent from the embodiments of semiconductor devices according to the invention illustrated by way of example on the accompanying drawing in which.

Figure 1:
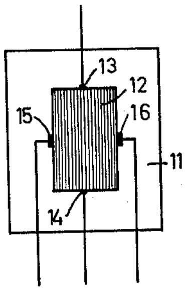
FIGS. 1 and 2 are explanatory and show respective plan views of a Hall-voltage generator and a magnetic-field responsive resistor according to prior art.

As shown in FIG. 1, a Hall voltage generator generally comprises a carrier plate 11 on whose planar top surface a Hall plate 12 is located. The carrier plate 11 may constitute the pole face of a magnet which furnishes a magnetic field perpendicular to the plane of the Hall plate. The top surface of carrier 11 may be coated with insulating material, or the carrier structure may consist of magnetically permeable but electrically insulating ferrite. The Hall plate 12 may consist of indium antimonide, indium arsenide or other semiconductor material. The Hall plate 12 is provided with terminals 13 and 14 at the narrow sides of its rectangular shape. During operation, an electric control current is passed through the Hall plate by means of the terminals 13 and 14. The Hall plate is further provided with two Hall electrodes 15 and 16 located on the respective long sides midway between the current supply terminals. During operation a Hall voltage is taken from across the electrodes 15 and 16. The Hall plate may have a thickness of 3 to 5 microns, a width of 1 to 2 mm. and a length of 2 to 5 mm., for example. The materials and dimensions just mentioned by way of example are also applicable to the semiconductor devices according to the invention still to be described.

Figure 2:
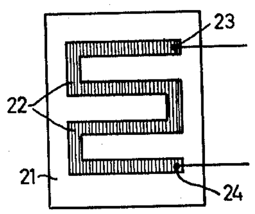

According to FIG. 2, a carrier plate 21 supports on its planar top surface a meander-shaped semiconductor strip 22 consisting, for example, of indium antimonide, gallium arsenide or other semiconductor substance. The terminal electrodes of the resistor strip are denoted by 23 and 24. Such a resistor is known under the term "field plate." When the resistor, connected in a sensing or control circuit, is subjected to a magnetic field, it changes its ohmic resistance so that the voltage drop between the electrodes 23 and 24 changes accordingly.

As mentioned above, the occurrence of a temperature difference between the electrodes 15 and 16 in a device according to FIG. 1, or between the electrodes 23 and 24 in a device according to FIG. 2, may result in a thermoelectric error voltage in the same order of magnitude or larger than the signal voltage issuing from the signal output electrodes. Such error voltages are avoided in the devices according to FIGS. 3 to 5 described presently.

Figure 3:
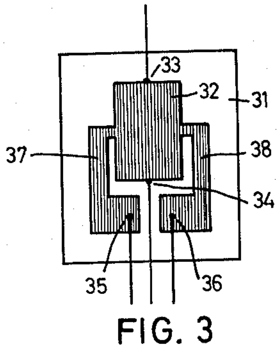
FIG. 3 is a plan view of a Hall-voltage generator according to the invention.

With respect to fundamental design and performance the Hall-voltage generator shown in FIG. 3 may correspond to that of FIG. 1, with the exception of the components that constitute the Hall electrodes. Denoted by 31 is the carrier plate, for example the insulated pole face of a ferrite core structure. Deposited upon the carrier plate is the semiconductor layer 32 with current supply terminals 33, 34 and Hall electrodes 35 and 36. These electrodes are integral with extremities or arms 37 and 38 which consist of the same material as the rectangular main portion 32 of the Hall plate and are integrally joined therewith. The extremities 37 and 38, extending toward oppoiste sides away from the respective midpoints at the long sides of the rectangular portion 32, have an increased width and hence an increased cross section where they extend parallel to the long sides of the rectangle and beyond the short side of portion 32 where the current terminal 34 is located. At the latter short side the two Hall electrodes 35 and 36, formed by the respective ends of the extremities, are close together so that their mutual distance is shorter than the short side of the rectangular main portion 32. That is, the two electrodes 35 and 36 are virtually at the same thermal potential so that substantially no temperature difference between them will occur regardless of changes in temperature in the Hall-plate crystalline material or the environment. As a result any thermal-error voltage remains negligibly small regardless of the width of the main portion 32 of the semiconductor body.

Figure 4:
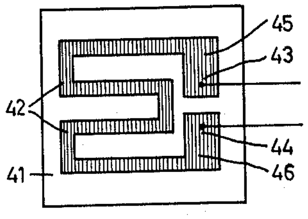
FIG. 4 is a plan view of a field resistor according to the invention.

The field plate according to FIG. 4 corresponds to the one described above with reference to FIG. 2, except for the modification of the signal electrodes. The carrier plate is denoted by 41, the meander-shaped strip of the semiconductor body by 42, and the electrodes by 43 and 44. The electrodes are in close proximity to each other by virtue of the addition of relatively wide extremities 45 and 46 to the fundamental meander shape of the resistor structure.

Figure 5:
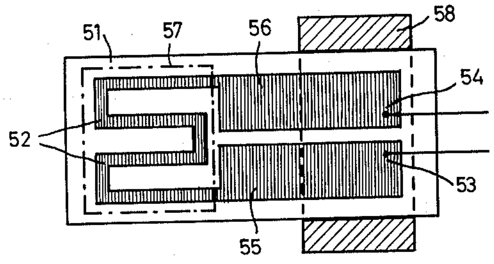
FIG. 5 is a modified embodiment of a field resistor.

In the embodiment of a field plate according to FIG. 5 the signal-issuing electrodes of a meander-shaped semiconducting resistor similar to that of FIG. 4 are arranged within a slot of a copper block and outside of the active range of the magnetic field which controls the resistance. The meander-shaped semiconductor body 52 is attached to the planar surface of an insulating carrier sheet 51. The signal electrodes 53 and 54 are located at the respective ends of rather wide extremities 55 and 56 which, in accordance with the embodiment of FIG. 4, are integral with the meander-shaped resistor and consist of the same semiconductor material. The active range of the magnetic field is indicated in FIG. 5 by a dot-and-dash line 57. The contour indicated by this line is that of a pole face from which the magnetic field penetrates the plane of illustration in a direction perpendicular thereto. The carrier sheet 51 with the extremities 55 and 56 of the semiconductor body extends through a slot in a copper block 58. By virtue of the copper block, the temperature of the electrodes 53 and 54 is virtually held at a constant temperature. Instead of a copper block, the temperature equalization can also be effected by a liquid medium, for example a good heat conducting oil, in which the electrodes at the extremities of the semiconductor body are immersed.

Aside from the fact that due to the spacial proximity of the signal electrodes in semiconductor devices according to the invention, the occurrence of thermoelectric error voltages is minimized and made negligible, it will be understood from the illustrated embodiments that the invention affords a particularly simple production of the semiconductor devices because it is only necessary, when depositing the semiconductor material upon its carrier or substrate, to employ a correspondingly shaped stencil or mask if a vapor deposition method is used. However, the necessary shape of the semiconductor body can also be produced by first coating the entire area with semiconductor material, then masking it with varnish, and then etching the material away at the localities not masked. Any subsequent assembling, contacting, soldering or other fusing jobs are thus avoided.

To those skilled in the art, it will be obvious upon a study of this disclosure that my invention permits of various modifications with respect to geometric shape, production method, or use of the semiconductor devices, and hence can be given embodiments other than particularly illustrated and described herein, without departing from the essential features of my invention and within the scope of the claims annexed hereto.

I claim:

1. An electronic semiconductor device comprising a crystalline semiconductor member having a plurality of mutually spaced electrode points of which two constitute a pair of signal output points, said member having a substantially flat and planar geometrical shape which comprises a main portion and two extremities integral with said main portion and consisting of the same material, said extremities extending away from said main portion in symmetrical relation thereto and having respective ends projecting toward the axis of symmetry into proximity of each other up to a distance smaller than the spacing between the respective junctions of said extremities with said main portion, said two signal output points being at said respective ends so as to be substantially located at thermally the same spot of the member plane, whereby thermal disturbance of the device is minimized.

2. An electronic semiconductor device according to claim 1, comprising a metal block having a slot, said ends of said extremities inclusive of said two signal output points being located in said slot for heat exchange with said block.

3. A galvanomagnetic semiconductor device comprising a crystalline semiconductor member having a plurality of mutually spaced electrode points of which two constitute a pair of signal output points, magnetic field means for providing a control field area, said member having a geometric shape constituting a main portion and extremities integral with said main portion and formed of the same material, said extremities extending away from said main portion in symmetrical relation thereto and having respective ends projecting toward the axis of symmetry into proximity of each other and up to a mutual distance smaller than the mutual spacing of said extremities at their respective junctions with said main portion, said two signal output points being at the ends of said respective extremities so as to be closer to each other than corresponds to said spacing and substantially located at thermally the same spot, said main portion being located in said field area of said field means, and said ends and output points being located outside of said field area.

4. An electronic semiconductor device comprising a Hall voltage generator having a planar-surface support and a crystalline semiconductor Hall member forming a layer on the planar surface of said support, said member having a substantially rectangular main layer portion with current-supply leads attached to its respective two short sides, and said member having two extremity portions integrally joined with said main portion and extending in opposite directions away from respective midpoints of the long sides of said main portion and further along said long sides to beyond one of said short sides, said extremity portions having respective ends located opposite said one short side and spaced from each other a fractional distance as compared with the length of said short side, and signal output leads attached to said respective ends.

5. A magnetic-field responsive resistor structure having a planar-surface support and a crystalline semiconductor layer on the planar surface of said support, said layer having a main portion forming a meander strip and having two integral extremity portions of larger width than said strip and extending from the respective strip ends toward each other in symmetrical relation to said main portion and symmetrically to each other along one side of the total meander area of said main portion, said two extremity portions having their respective ends spaced from each other a fractional distance as compared with the length of said side, and terminal leads attached to said extremity portions near said respective ends.

References Cited by the Examiner

FOREIGN PATENTS 705,606 3/1954 Great Britain.

DAVID J. GALVIN, *Primary Examiner.*